(12) United States Patent
Fandrey et al.

(10) Patent No.: US 6,511,337 B1
(45) Date of Patent: Jan. 28, 2003

(54) ENVIRONMENTALLY SEALED INSTRUMENT LOOP ADAPTER

(75) Inventors: Mark C. Fandrey, Eden Prairie, MN (US); Paul Sundet, Savage, MN (US); Rob LaRoche, Eden Prairie, MN (US); Scott D. Nelson, Plymouth, MN (US); George C. Hausler, Maple Grove, MN (US)

(73) Assignee: Rosemount Inc., Eden Prairie, MN (US)

( * ) Notice: Subject to any disclaimer, the term of this patent is extended or adjusted under 35 U.S.C. 154(b) by 30 days.

(21) Appl. No.: 09/671,130

(22) Filed: Sep. 27, 2000

Related U.S. Application Data
(60) Provisional application No. 60/156,369, filed on Sep. 28, 1999.

(51) Int. Cl.[7] .................... H01R 4/38; H01R 13/62
(52) U.S. Cl. .................. 439/320; 439/206; 439/604; 439/912; 439/447
(58) Field of Search .................. 439/320, 589, 439/604, 206, 447, 76.1, 322, 323, 912

(56) References Cited

U.S. PATENT DOCUMENTS

| | | | |
|---|---|---|---|
| 3,040,287 A | * 6/1962 | Agron et al. | 439/275 |
| 3,701,280 A | 10/1972 | Stroman | 73/194 |
| 3,945,701 A | * 3/1976 | Boeke et al. | 439/320 |
| 3,968,694 A | 7/1976 | Clark | 73/398 |
| 4,120,206 A | 10/1978 | Rud, Jr. | 73/718 |

(List continued on next page.)

FOREIGN PATENT DOCUMENTS

| | | |
|---|---|---|
| DE | 37 41 648 | 7/1988 |
| DE | G 91 09 176.4 | 10/1991 |
| DE | 197 45 244 A1 | 4/1998 |
| DE | 299 03 260 U1 | 5/2000 |
| EP | 0 063 685 A1 | 11/1982 |
| EP | 0 214 801 A1 | 3/1987 |
| EP | 0 223 300 A2 | 5/1987 |
| EP | 0 268 742 A1 | 7/1987 |
| EP | 6390391 A1 | 2/1995 |
| EP | 0 167 941 A2 | 6/1995 |
| EP | 0 903 651 A1 | 3/1999 |
| JP | 401313038 A | 12/1989 |
| JP | 2000112470 | 10/1998 |
| JP | 2000121470 | 10/1998 |
| WO | WO 88/01417 | 2/1988 |
| WO | WO 89/02578 | 3/1989 |
| WO | WO 89/04089 | 5/1989 |
| WO | WO 90/15975 | 12/1990 |
| WO | WO 91/18266 | 11/1991 |
| WO | W0 96/34264 | 10/1996 |
| WO | WO 98/48489 | 10/1998 |
| WO | WO 00/23776 | 4/2000 |

OTHER PUBLICATIONS

U.S. patent application Ser. No. 09/929,603, Wertz et al., filed Aug. 13, 2001.
U.S. patent application Ser. No. 09/671,495, Behm et al., filed Sep. 27, 2000.
U.S. patent application Ser. No. 09/519,781, Nelson et al., filed Mar. 7, 2000.

(List continued on next page.)

*Primary Examiner*—Javaid Nasri
(74) *Attorney, Agent, or Firm*—Westman, Champlin & Kelly, P.A.

(57) ABSTRACT

An environmentally sealed instrument circuit adapter connecting a process transmitter to instrument wiring. An environmentally sealing elastomeric part seals between a lip on an outer sleeve and a connector header of the process transmitter. One or more washers can provide sealing between the lip and the elastomeric part when tightened. The adapter protects contact pins, sockets and loop wires from damage due to liquids, humidity, dust and other contaminants.

19 Claims, 8 Drawing Sheets

U.S. PATENT DOCUMENTS

| | | | |
|---|---|---|---|
| 4,125,027 A | 11/1978 | Clark | 73/724 |
| 4,238,825 A | 12/1980 | Geery | 364/510 |
| 4,250,490 A | 2/1981 | Dahlke | 340/870.37 |
| 4,287,501 A | 9/1981 | Tominaga et al. | 338/42 |
| 4,414,634 A | 11/1983 | Louis et al. | 364/510 |
| 4,419,898 A | 12/1983 | Zanker et al. | 73/861.02 |
| 4,446,730 A | 5/1984 | Smith | 73/301 |
| 4,455,875 A | 6/1984 | Guimard et al. | 73/708 |
| 4,485,673 A | 12/1984 | Stern | 73/304 |
| 4,528,855 A | 7/1985 | Singh | 73/721 |
| 4,562,744 A | 1/1986 | Hall et al. | 73/861.02 |
| 4,598,381 A | 7/1986 | Cucci | 364/558 |
| 4,602,344 A | 7/1986 | Ferretti et al. | 364/509 |
| 4,617,607 A | 10/1986 | Park et al. | 361/283 |
| D287,827 S | 1/1987 | Broden | D10/46 |
| 4,644,797 A | 2/1987 | Ichikawa et al. | 73/706 |
| 4,653,330 A | 3/1987 | Hedtke | 73/756 |
| 4,677,841 A | 7/1987 | Kennedy | 73/30 |
| 4,745,810 A | 5/1988 | Pierce et al. | 73/706 |
| D296,995 S | 8/1988 | Lee | D10/46 |
| D297,314 S | 8/1988 | Hedtke | D10/46 |
| D297,315 S | 8/1988 | Pierce et al. | D10/85 |
| 4,783,659 A | 11/1988 | Frick | 340/870.37 |
| 4,798,089 A | 1/1989 | Frick et al. | 73/706 |
| 4,818,994 A | 4/1989 | Orth et al. | 340/870.21 |
| 4,825,704 A | 5/1989 | Aoshima et al. | 73/861.42 |
| 4,833,922 A | 5/1989 | Frick et al. | 73/756 |
| 4,850,227 A | 7/1989 | Luettgen et al. | 73/708 |
| 4,866,989 A | 9/1989 | Lawless | 73/756 |
| 4,881,412 A | 11/1989 | Northedge | 73/861.04 |
| 4,930,353 A | 6/1990 | Kato et al. | 73/727 |
| 4,958,938 A | 9/1990 | Schwartz et al. | 374/208 |
| 4,970,898 A | 11/1990 | Walish et al. | 73/706 |
| 4,980,675 A | 12/1990 | Meisenheimer, Jr. | 340/626 |
| 5,000,047 A | 3/1991 | Kato et al. | 73/706 |
| D317,266 S | 6/1991 | Broden et al. | D10/46 |
| D317,269 S | 6/1991 | Selg | D10/52 |
| D318,432 S | 7/1991 | Broden et al. | D10/46 |
| 5,028,746 A | 7/1991 | Petrich | 191/12.2 R |
| 5,035,140 A | 7/1991 | Daniels et al. | 73/290 |
| 5,051,937 A | 9/1991 | Kawate et al. | 364/571.01 |
| 5,058,437 A | 10/1991 | Chaumont et al. | 73/861.21 |
| 5,070,732 A | 12/1991 | Duncan et al. | 73/431 |
| 5,083,091 A | 1/1992 | Frick et al. | 324/678 |
| 5,087,871 A | 2/1992 | Losel | 323/299 |
| 5,094,109 A | 3/1992 | Dean et al. | 73/718 |
| D329,619 S | 9/1992 | Cartwright | D10/52 |
| 5,142,914 A | 9/1992 | Kusakabe et al. | 73/723 |
| 5,157,972 A | 10/1992 | Broden et al. | 73/706 |
| 5,162,725 A | 11/1992 | Hodson et al. | 324/115 |
| 5,187,474 A | 2/1993 | Kielb et al. | 340/870.18 |
| 5,212,645 A | 5/1993 | Wildes et al. | 364/463 |
| 5,227,782 A | 7/1993 | Nelson | 340/870.11 |
| 5,236,202 A | 8/1993 | Krouth et al. | 277/164 |
| 5,245,333 A | 9/1993 | Anderson et al. | 340/870.3 |
| 5,248,167 A | 9/1993 | Petrich et al. | 285/23 |
| D342,456 S | 12/1993 | Miller et al. | D10/60 |
| 5,276,631 A | 1/1994 | Popovic et al. | 364/571.04 |
| 5,287,746 A | 2/1994 | Broden | 73/706 |
| 5,353,200 A | 10/1994 | Bodin et al. | 361/816 |
| 5,369,386 A | 11/1994 | Alden et al. | 335/206 |
| 5,377,547 A | 1/1995 | Kusakabe et al. | 73/723 |
| 5,381,355 A | 1/1995 | Birangi et al. | 364/724.01 |
| D358,784 S | 5/1995 | Templin, Jr. et al. | D10/96 |
| 5,436,824 A | 7/1995 | Royner et al. | 363/89 |
| 5,448,180 A | 9/1995 | Kienzler et al. | 326/15 |
| 5,469,150 A | 11/1995 | Sitte | 340/825.07 |
| 5,471,885 A | 12/1995 | Wagner | 73/862.041 |
| D366,000 S | 1/1996 | Karas et al. | D10/60 |
| D366,218 S | 1/1996 | Price et al. | D10/52 |
| 5,495,768 A | 3/1996 | Louwagie et al. | 73/706 |
| 5,498,079 A | 3/1996 | Price | 374/208 |
| 5,502,659 A | 3/1996 | Braster et al. | 364/571.01 |
| 5,524,333 A | 6/1996 | Hogue et al. | 29/593 |
| 5,524,492 A | 6/1996 | Frick et al. | 73/706 |
| 5,546,804 A | 8/1996 | Johnson et al. | 73/431 |
| 5,600,782 A | 2/1997 | Thomson | 395/182.02 |
| 5,606,513 A | 2/1997 | Louwagie et al. | 364/510 |
| 5,649,835 A * | 7/1997 | Weed | 439/320 |
| 5,650,936 A | 7/1997 | Loucks et al. | 364/483 |
| 5,656,782 A | 8/1997 | Powell, II et al. | 73/756 |
| 5,665,899 A | 9/1997 | Willcox | 73/1.63 |
| 5,668,322 A | 9/1997 | Broden | 73/756 |
| 5,669,713 A | 9/1997 | Schwartz et al. | 374/1 |
| 5,670,722 A | 9/1997 | Moser et al. | 73/756 |
| 5,677,476 A | 10/1997 | McCarthy et al. | 73/29.01 |
| 5,710,552 A * | 1/1998 | McCoy et al. | 340/870.21 |
| 5,754,596 A | 5/1998 | Bischoff et al. | 375/295 |
| 5,764,928 A | 6/1998 | Lancott | 395/285 |
| 5,823,228 A | 10/1998 | Chou | 137/597 |
| 5,870,695 A | 2/1999 | Brown et al. | 702/138 |
| 5,899,692 A | 5/1999 | Louwagie et al. | 702/138 |
| 5,920,016 A | 7/1999 | Broden | 73/756 |
| 5,948,988 A | 9/1999 | Bodin | 73/706 |
| 5,954,526 A | 9/1999 | Smith | 439/136 |
| 5,955,684 A | 9/1999 | Gravel et al. | 73/866.5 |
| 5,973,942 A | 10/1999 | Nelson et al. | 363/21 |
| 5,983,727 A | 11/1999 | Wellman et al. | 73/724 |
| 5,988,203 A | 11/1999 | Hutton | 137/597 |
| 6,006,338 A | 12/1999 | Longsdorf et al. | 713/340 |
| 6,038,927 A | 3/2000 | Karas | 73/706 |
| 6,050,145 A | 4/2000 | Olson et al. | 73/706 |
| 6,059,254 A | 5/2000 | Sundet et al. | 248/678 |
| 6,105,437 A | 8/2000 | Klug et al. | 73/756 |
| 6,111,888 A | 8/2000 | Green et al. | 370/461 |
| 6,115,831 A | 9/2000 | Hanf et al. | 714/43 |
| 6,123,585 A | 9/2000 | Hussong et al. | 439/652 |
| 6,131,467 A | 10/2000 | Miyano et al. | 73/756 |
| 6,140,952 A | 10/2000 | Gaboury | 341/143 |
| 6,151,557 A | 11/2000 | Broden et al. | 702/47 |
| 6,216,172 B1 | 4/2001 | Koblin et al. | 709/253 |
| 6,233,532 B1 | 5/2001 | Boudreau et al. | 702/89 |
| 6,295,875 B1 | 10/2001 | Frick et al. | 73/718 |
| 6,311,568 B1 | 11/2001 | Kleven | 73/861.42 |
| 6,321,166 B1 | 11/2001 | Evans et al. | 702/50 |

OTHER PUBLICATIONS

U.S. patent application Ser. No. 09/520,292, Davis et al., filed Mar. 7, 2000.

U.S. patent application Ser. No. 09/519,912, Nelson et al., filed Mar. 7, 2000.

U.S. patent application Ser. No. 09/672,338, Nelson et al., filed Sep. 28, 2000.

U.S. patent application Ser. No. 09/638,181, Roper et al., filed Jul. 31, 2000.

U.S. patent application Ser. No. 09/571,111, Westfield et al., filed May 15, 2000.

U.S. patent application Ser. No. 09/564,506, Nord et al., filed May 4, 2000.

U.S. patent application Ser. No. 09/667,289, Westfield et al., filed Sep. 22, 2000.

U.S. patent application Ser. No. 09/667,399, Behm et al., filed Sep. 21, 2000.

U.S. patent application Ser. No. 29/120,531, Fandrey et al., filed Mar. 21, 2000.

U.S. patent application Ser. No. 29/120,544, Fandrey et al., filed Mar. 21, 2000.

U.S. patent application Ser. No. 29/120,538, Fandrey et al., filed Mar. 21, 2000.

U.S. patent application Ser. No. 29/120,552, Fandrey et al., filed Mar. 21, 2000.

U.S. patent application Ser. No. 29/120,537, Fandrey et al., filed Mar. 21, 2000.

U.S. patent application Ser. No. 29/120,553, Fandrey et al., filed Mar. 21, 2000.

Product Data Sheet No.: 00813–0100–4378, "Model 751 Field Signal Indicator", by Rosemount Inc., Eden Prairie, Minnesota, (1997). No month.

Product Data Sheet No.: 00813–0100–4731, "APEX™ Radar Gauge", by Rosemount Inc., Eden Prairie, Minnesota, (1998). No month.

Product Data Sheet No.: 00813–0100–4640, "Model 3201 Hydrostatic Interface Unit", from the Rosemount Comprehensive Product Catalog, published 1998, by Rosemount Inc., Eden Prairie, Minnesota. No month.

Product Data Sheet No.: 00813–0100–4003, "Model 8800A", by Rosemount Inc., Eden Prairie, Minnesota, (1998). No month.

Product Data Sheet No.: 00813–0100–4773, "Model 8742C—Magnetic Flowmeter Transmitter with FOUNDATION™ Fieldbus", from the Rosemount Comprehensive Product Catalog, published 1998, by Rosemount Inc., Eden Prairie, Minnesota. No month.

"Rosemount Model 8732C Magnetic Flowmeter Transmitter", by Rosemount Inc., Eden Prairie, Minnesota, (1998). No month.

Product Data Sheet No.: 00813–0100–4263, "Model 444 Alphaline® Temperature Transmitters", by Rosemount Inc., Eden Prairie, Minnesota, (1997). No month.

Product Data Sheet No.: 00813–0100–4769, "Model 3244MV Multivariable Temperature Transmitter with FOUNDATION™ Fieldbus", by Rosemount Inc., Eden Prairie, Minnesota, (1998). No month.

Product Data Sheet No.: 00813–0100–4724, "Models 3144 and 3244MV Smart Temperature Transmitters", by Rosemount Inc., Eden Prairie, Minnesota, (1998). No month.

Product Data Sheet No.: 00813–0100–4738, "Model 3095FB Multivariable™ Transmitter with Modbus™ Protocol", by Rosemount Inc., Eden Prairie, Minnesota, (1996, 1997). No month.

Product Data Sheet No.: 00813–0100–4001, "Model 3051 Digital Pressure Transmitter for Pressure, Flow, and Level Measurement", by Rosemount Inc., Eden Prairie, Minnesota, (1998). No month.

Product Data Sheet No.: 00813–0100–4698, "Model 2090F Sanitary Pressure Transmitter", by Rosemount Inc., Eden Prairie, Minnesota, (1998). No month.

Product Data Sheet No.: 00813–0100–4690, "Model 2088 Economical Smart Pressure Transmitter", by Rosemount Inc., Eden Prairie, Minnesota, (1998). No month.

Product Data Sheet No.: 00813–0100–4592, "Model 2024 Differential Pressure Transmitter", by Rosemount Inc., Eden Prairie, Minnesota, (1987–1995). No month.

Product Data Sheet No.: 00813–0100–4360, "Model 1151 Alphaline® Pressure Transmitter", by Rosemount Inc., Eden Prairie, Minnesota, (1998). No month.

Product Data Sheet No.: 00813–0100–4458, "Model 1135F Pressure–to–Current Converter", by Rosemount Inc., Eden Prairie, Minnesota, (1983, 1986, 1994). No month.

"Single Chip Senses Pressure and Temperature," *Machine Design*, 64 (1992) May 21, No. 10.

Brochure: "Reduce Unaccounted–For Natural Gas with High–Accuracy Pressure Transmitters," Rosemount Inc. Measurement Division, Eden Prairie, Minnesota, ADS 3073, May 1991, pp. 1–4.

Technical Information Bulletin, "Liquid Level Transmitter Model DB40RL Sanitary Sensor *deltapilot*," Endress + Hauser, Greenwood, Indiana, Sep. 1992. pp. 1–8.

"The Digitisation of Field Instruments" W. Van Der Bijl, *Journal A*, vol. 32, No. 3, 1991, pp. 62–65. No month.

Specification Summary, "TELETRANS™ 3508–30A Smart Differential Pressure Transmitter," (undated) Bristol Babcock, Inc., Watertown, CT, 06795. No date.

Specification Summary, "TELETRANS™ 3508–10A Smart Pressure Transmitter," (undated) Bristol Babcock, Inc., Watertown, CT, 06795. No date.

Specification Summary, "AccuRate Advanced Gas Flow Computer, Model GFC 3308," (undated) Bristol Babcock, Inc., Watertown, CT, 06795. No date.

Product Data Sheet PDS 4640, "Model 3201 Hydrostatic Interface Unit," Mar. 1992, Rosemount Inc., Eden Prairie, MN 55344.

Product Data Sheet PDS 4638, "Model 3001CL Flush-–Mount Hydrostatic Pressure Transmitter," Jul. 1992, Rosemount Inc., Eden Prairie, MN 55344.

"Flow Measurement," *Handbook of Fluid Dynamics*, V. Streeter, Editor–in–chief, published by McGraw–Hill Book Company, Inc. 1961, pp. 14–4 to 14–15. No month.

"Precise Computerized In–Line Compressible Flow Metering," *Flow—Its Measurement and Control in Science and Industry*, vol. 1, Part 2, Edited by R. Wendt, Jr., Published by American Institute of Physics et al, (undated) pp. 539–540. No date.

"A Systems Approach," Dr. C. Ikoku, *Natural Gas Engineering*, PennWell Books, (undated) pp. 256–257. No date.

"Methods for Volume Measurement Using Tank–Gauging Devices Can Be Error Prone," F. Berto, *The Advantages of Hydrostatic Tank Gauging Systems*, undated reprint from *Oil & Gas Journal*. No date.

"Hydrostatic Tank Gauging— Technology Whose Time Has Come," J. Berto, *Rosemount Measurement Division Product Feature*, undated reprint from *INTECH*. No date.

"Pressure Sensors Gauge Tank Level and Fluid Density," *Rosemount Measurement Division Product Feature*, undated repriint from *Prepared Foods*, (Copyrighted 1991 by Gorman Publishing Company). No month.

"Low Cost Electronic Flow Measurement System," *Tech Profile*, May 1993, Gas Research Institute, Chicago, IL.

"Development of an Integrated EFM Device for Orifice Meter Custody Transfer Applications," S.D. Nieberle et al., *American Gas Association Distribution/Transmission Conference & Exhibit*, May 19, 1993.

Advertisement, AccuRate Model 3308 Integral Smart DP/P/T Transmitter, (undated) Bristol Babcock, Inc., Watertown, CT 06795. No date.

Advertisement, Model 3508 DP Transmitter, *Control Engineering*, Dec. 1992, Bristol Babcock, Inc., Watertown, CT 06795.

"Smart Transmitter Tear Up The Market," C. Polsonetti, *INTECH*, Jul. 1993, pp. 42–45.

"MicroLAN Design Guide", Dallas Semiconductor, Tech Brief No. 1, (undated). No date.

"Bosch CAN Specification Version 2.0", by Robert Bosch GmbH, pp. 1–68 including pp. –1– and –2–, (Sep. 1991).

Product Data Sheet No.: 00813–0100–4001, "Digital Pressure Transmitter for Pressure, Flow, and Level Measurement", by Rosemount Inc., (1998). No month.

"Claudius Ptolemy (100?–107? AD)", *M&C* News, 7 pages, (Apr. 1994).

American National Standard , "Hydraulic Fluid Power–Solenoid Piloted Industrial Valves–Interface Dimensions for Electrical Connectors", National Fluid Power Association, Inc., 10 pages, (Aug. 1981).

U.S. patent application Ser. No. 09/862,762, Wang, filed May 21, 2001.

U.S. patent application Ser. No. 09/867,961, Fandrey et al., filed May 30, 2001.

* cited by examiner

ENVIRONMENTALLY SEALED INSTRUMENT LOOP ADAPTER

REFERENCE TO CO-PENDING APPLICATION

This application claims priority benefits from U.S. provisional patent application No. 60/156,369 entitled UNITIZED MODULARITY IN A PROCESS TRANSMITTER filed on Sep. 28, 1999.

FIELD OF THE INVENTION

The present invention relates to instruments such as transmitters used to measure fluid characteristics in industrial fluid processing plants. In particular, the present invention relates to electrically connecting process transmitters to transmit over an instrument loop in an industrial environment where contaminants may be present.

BACKGROUND OF THE INVENTION

Process transmitters are used to monitor the operation of industrial processes such as those in oil refineries, chemical processing plants and the like. Process transmitters such as pressure transmitters are typically situated in a fluid processing plant in locations where liquids, dust and humidity and various industrial contaminants may be present. In some environments, process liquids such as an acid or base solution can be present. Liquids can also include spray from hoses used to clean plant equipment. The liquids can drip, splash or spray onto the process transmitter and its electrical connections. Dust, humidity, and liquids in the environment can contaminate and degrade the electrical connections to the process transmitter.

Process transmitters are often fitted with sealed wiring compartments that can be connected with sealed electric conduits to protect the loop wiring and electrical connections from deterioration by contaminants. In the case of a miniaturized process transmitter that uses a header-type connector, however, there is no sealed wiring compartment to protect exposed electrical contact pins in the header from contaminants.

Protective adapters are needed that can connect to contact pins in a header on a process transmitter and that can protect the contact pins and the wiring from contaminants without the addition of a costly and bulky wiring compartment.

SUMMARY OF THE INVENTION

With the present invention, An environmentally sealed electrical adapter protects contact pins, contact sockets and wiring from liquids, humidity and other contaminants.

The adapter includes wires that have one end connected to sockets that can be mated with contact pins inside a header on a process transmitter. The adapter can include a sleeve that screws onto the header. The sleeve has a lip that faces toward the cylindrical header.

An environmentally sealing elastomeric part and a washer are compressed between the lip and the cylindrical header. The washer has a washer surface that slides relative to the lip as the threads are tightened. The elastomeric part is compressed and a liquid-proof seal is formed between the elastomeric part and the sealing surface.

The contact pins, contact sockets and wire ends are effectively environmentally sealed by the elastomeric part and protected from damage from environmental contaminants.

DETAILED DESCRIPTION OF THE ILLUSTRATED EMBODIMENTS

An environmentally sealed instrument electrical adapter connects a process transmitter to a multi-wire instrument circuit. An environmental seal in the form of an elastomeric part seals the wires and fits between a lip on a threaded outer sleeve and a threaded connector header of the process transmitter. Thrust washers can be used to provide sliding between the lip and the elastomeric part to limit twisting of the elastomeric part when the threads are tightened. The elastomeric part remains flat as the threads are tightened and forms a good seal against environmental contaminants. The adapter protects contact pins, sockets and loop wires from damage due to liquids that are sprayed, dripped or splashed on the process transmitter, as well as dust, humidity and other contaminants. The adapter can be used to provide any type of electrical connection to the transmitter such as a 2 wire loop or a digital data connection.

Figure 1:
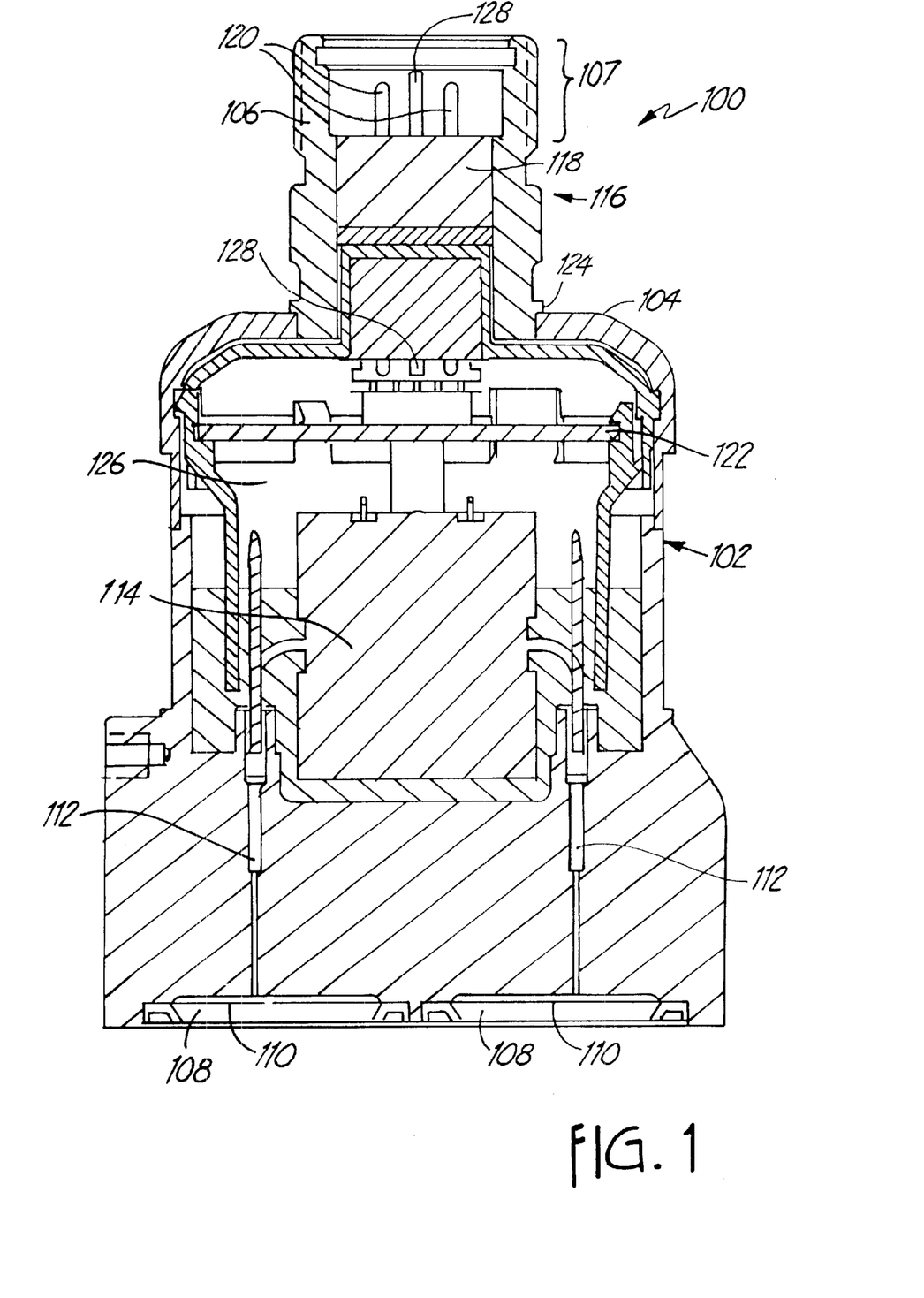
FIG. 1 is a cross-sectional illustration of a miniature pressure transmitter with a header and contact pins.

FIG. 1 is a cross-sectional view of a differential pressure transmitter 100. Transmitter 100 is an example of process transmitter on which an environmentally sealed adapter (not shown in FIG. 1) can be used to make connections to an instrument circuit.

Transmitter 100 includes a miniature transmitter housing 102 with an outer wall 104 sealed to an electrical connector header 106. Transmitter housing 102 includes two coplanar fluid inlets 108 that include isolator diaphragms 110. Isolator fluid 112 sealed in passageways transmits differential pressure from the inlets 108 to a capacitive differential pressure sensor 114 in transmitter 100.

The transmitter 100 includes a sealed feedthrough electrical connector 116 with a cylindrical outer shell or header 106 and a sealed insulating feedthrough 118 with electrical contact or pins 120. Header 106 has external threads 107. Two or more of the contact pins 120 carry loop data to communicate with the transmitter 100.

A circuit board 122 electrically couples to the pressure sensor 114. The circuit board 122 processes data from the pressure sensor 114 and controls the loop current on contact pins 120 to provide a representation of the differential pressure at inlets 108. The pressure can be represented as a 4–20 mA analog current, or can be represented in any of a variety of know digital protocols such as HART, CAN, Foundation Fieldbus, Profibus protocols and other digital communication protocols known in the fluid process control industry.

The outer wall 104 is preferably welded together with the header 106 along a circular weld joint 124, forming a sealed cavity 126 inside the housing 102. A capillary tube 128 is provided in the insulating feedthrough 118 for testing for leaks prior to sealing the tube 128 to provide hermetic sealing of sealed cavity 126 in miniature differential pressure transmitter 100.

Transmitter 100 as illustrated in FIG. 1 is a miniature type transmitter that does not include a sealed wiring compartment for making connections in the field to an instrument circuit. Contact pins 120 and insulating feedthrough 118 are exposed on the outside of the transmitter 100 and are subject to undesired contact with contaminants such as dust, humidity or liquids that are sprayed, dripped or spilled in a fluid processing plant environment.

Figure 2:
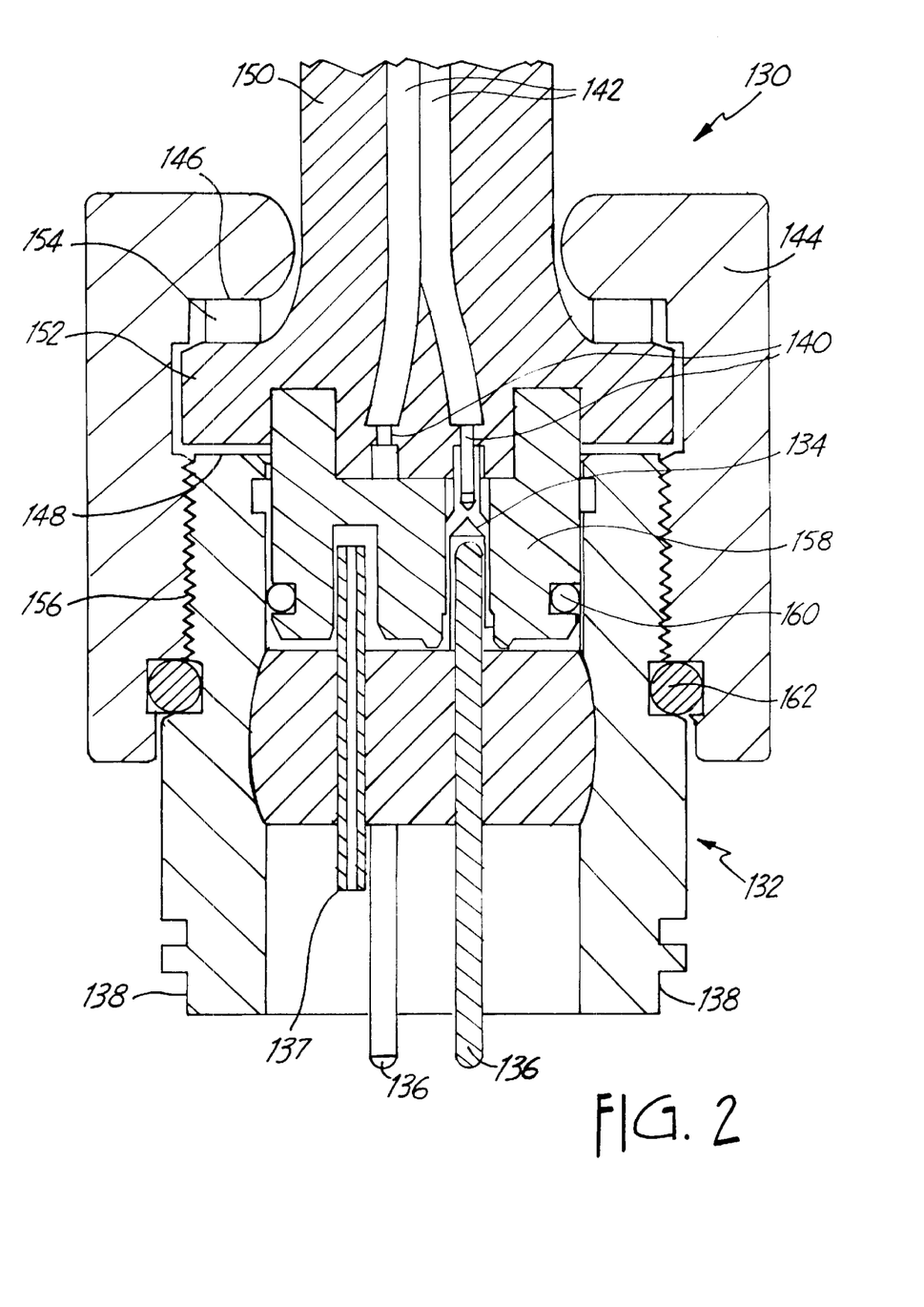
FIG. 2 is a cross-sectional illustration of an environmentally sealed adapter installed on a header.

FIG. 2 is a cross-sectional illustration of an environmentally sealed instrument circuit adapter 130 sealed to a header 132 of a process transmitter such as transmitter 100 of FIG. 1. Adapter 130 includes multiple electrical contact sockets 134 configured to mate with multiple contact pins 136 inside the connector header 132. Connector header 132 also includes a capillary tube 137 for testing for leaks prior to sealing the capillary tube 137. Connector header 132 is welded at 138 to a sealed process transmitter housing (not shown in FIG. 2). The multiple electrical contact sockets 134 are configured to connect with corresponding first wire ends 140 of a multiwire instrument circuit 142. A cylindrical sleeve 144 screws on the header 132. The sleeve 144 has a lip 146 that compresses elastomeric rim 152 of elastomeric boot 150 on sealing surface 148 on the header 132. An elastomeric boot 150 environmentally seals to the loop wires 142. The elastomeric boot 150 is preferably molded around the loop wires 142. The elastomeric boot 150 includes an elastomeric rim 152 between the lip 146 and the sealing surface 148. At least one washer 154 is located between the lip 146 and the elastomeric rim 152. The washer 154 has a washer surface that is smooth and that slides relative to the lip 146 so that twisting of the elastomeric rim 152 is limited as the sleeve 144 is tightened on threads 156 to form an environmental seal between elastomeric rim 152 and sealing surface 148. Elastomeric rim 152 is compressed uniformly and forms a continuous annular seal to the sealing surface 148.

The washer 154 functions as a thrust washer. The washer 154 uniformly transmits compressive force to the elastomeric rim 152, but slides in a rotational direction so that elastomeric rim 152 is substantially isolated from twisting force as the sleeve 144 is screwed on. In one preferred arrangement, a plurality of washers 154 with smooth, sliding surfaces are stacked between the lip 146 and the elastomeric rim 152. If desired, washers 154 can be self-centering washers.

Adapter 130 also includes a rigid insulating support 158 that positions and supports the electrical contact sockets 134. A first O-ring 160 at the base of support 158 and a second O-ring 162 between the sleeve 144 and the header 132 provide additional moisture-proofing seals. In some embodiments, the washer 154 and/or O-ring 162 may not be separate parts but are instead integrally fabricated with other components.

Figure 3:
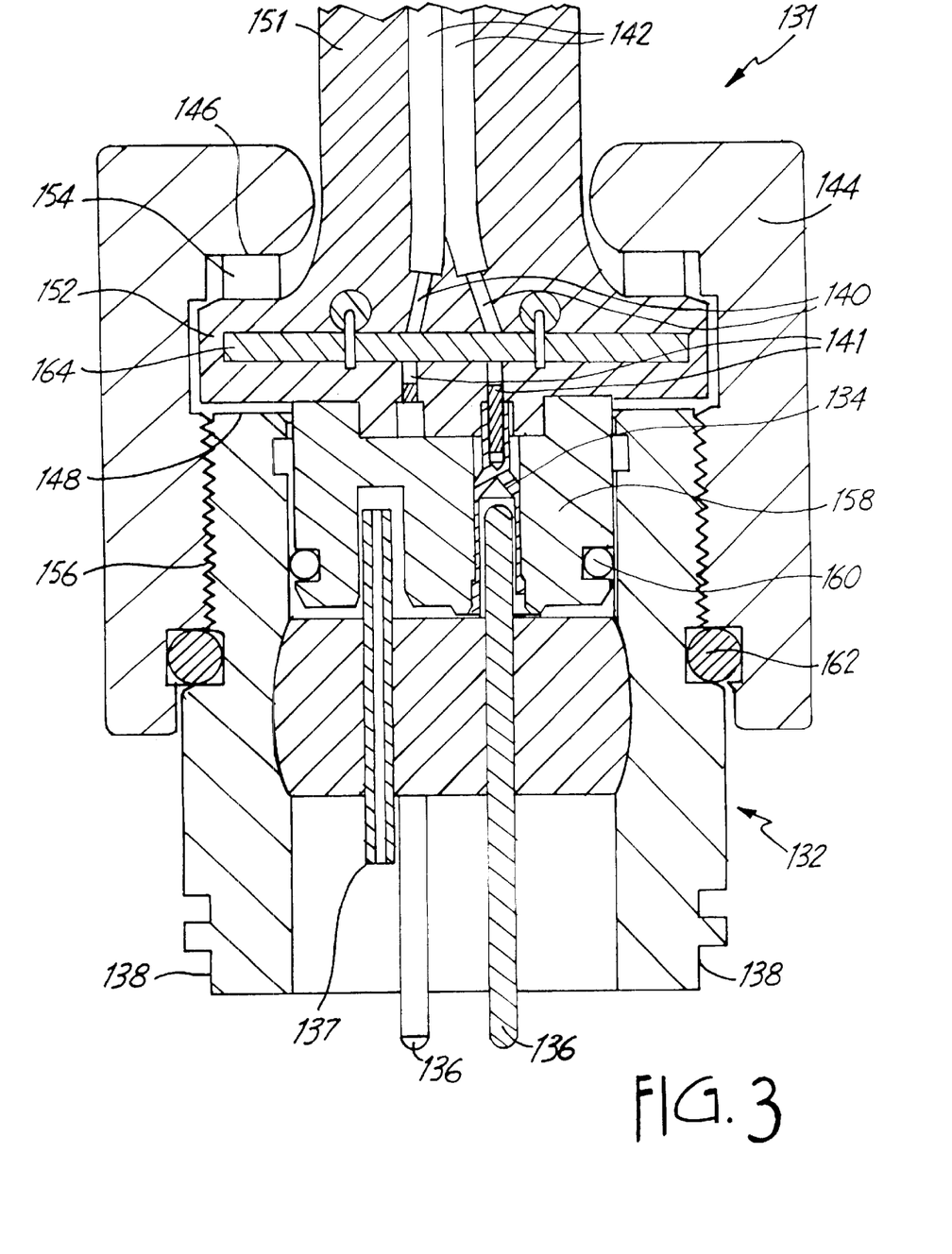
FIG. 3 is a cross-sectional illustration of an environmentally sealed adapter with an RFI/EMI filter installed on a header.

FIG. 3 illustrates a cross-sectional view of an environmentally sealed adapter 131 with an optional circuit 164. Circuit 164 can be an RFI/EMI filter, for example. Adapter 131 is similar to adapter 130 of FIG. 2 and similar or identical parts are identified with the same reference numbers. In adapter 131, the first wire ends 140 of an instrument circuit 142 do not connect directly to the electrical contact sockets 134, but instead are indirectly connected through the RFI/EMI filter 164 to contact sockets 134. After passing through the EMI/RFI filter 164, signals from the instrument circuit 142 are connected to electrical contact sockets 134 by wires 141. EMI/RFI Filter 164 can includes a circuit board with electrical components that provide radio frequency interference (RFI) filtering, also called electromagnetic interference (EMI) filtering. An example of such an RFI/EMI filter circuit is described in more detail below in connection with FIG. 4. Elastomeric boot 151 is formed around the RFI/EMI filter 164 as illustrated. In a preferred arrangement the RFI/EMI filter 164 is molded into the elastomeric boot 151.

Figure 4:
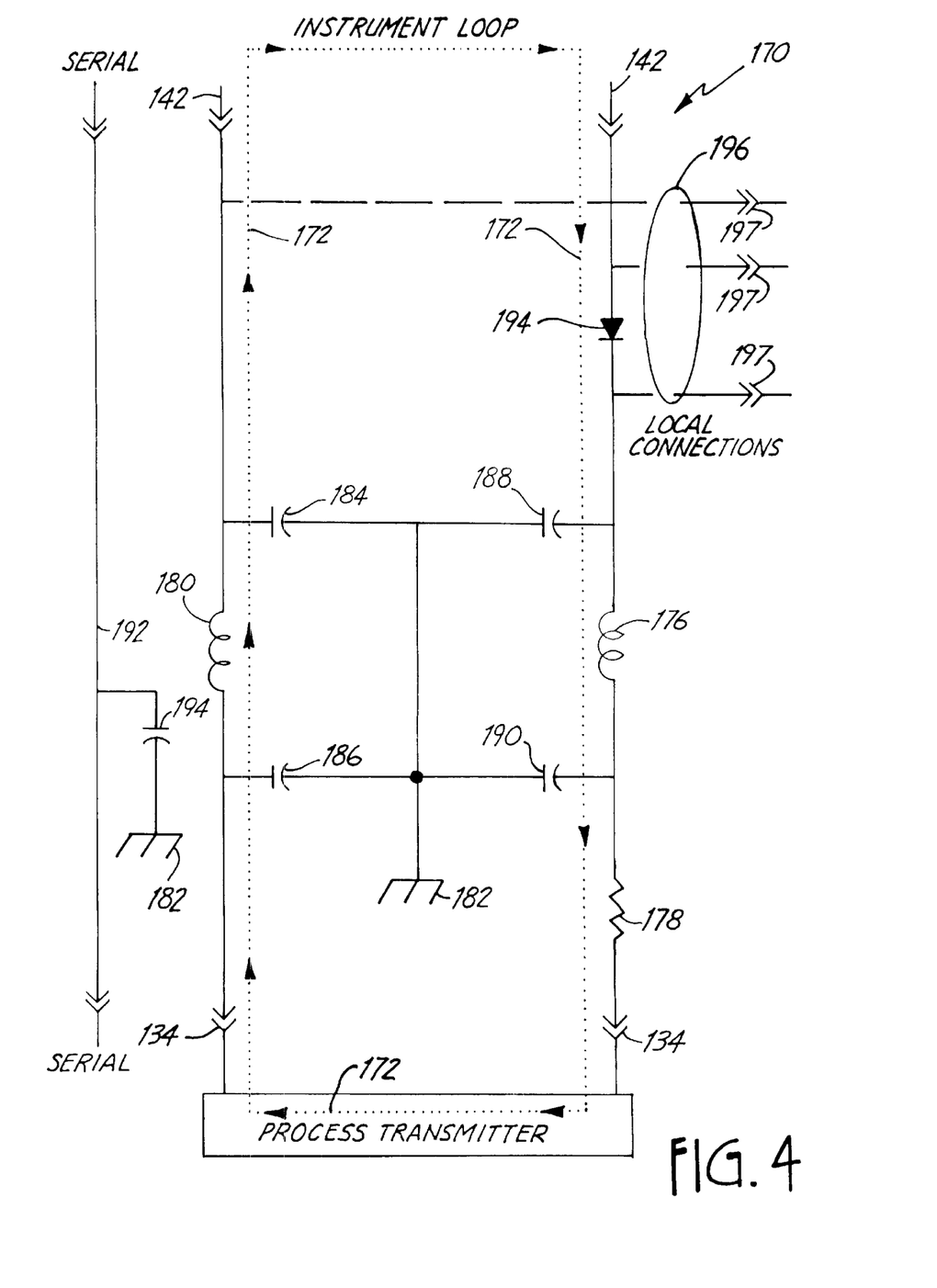
FIG. 4 is a schematic diagram of an RFI/EMI filter.

FIG. 4 is an electrical schematic diagram of an RFI/EMI filter 170. Filter 170 connects to an instrument circuit 142. Filter 170 also connects to contact pins 134 of adapter 131. Filter 170 can have a low pass frequency characteristic or a bandpass frequency characteristic. Filter 170 allows lower frequency communication signals from the instrument circuit 142 to pass to contact pins 134 on the adapter 131. Filter 170, however, filters out or blocks higher frequency noise so that it does not reach the contact pins 134 of the adapter. Signal currents flow along a circuit path indicated by dotted line 172 through rectifier 194, inductor 176, resistor 178, the process transmitter, inductor 180 and the instrument circuit 142. Noise (RFI/EMI) from the instrument circuit is conducted to ground 182 by pi-section low pass filters formed from the impedance of the loop, inductors 176, 180 and capacitors 184, 186, 188 and 190. In a preferred embodiment, a separate conductor 192 is provided for a local serial communication signal. The local serial communication signal can be used for communication over short distances within a few meters of the transmitter. The local serial communication signal can be used for electrically programming the transmitter, or for local communication between transmitters that are located in close proximity to one another. Capacitor 194 is connected between separate conductor 192 and ground 182 to provide EMI/RFI noise suppression. Various types of RFI/EMI filter circuits can be used, depending on the frequency of the data communication protocol used on the instrument circuit.

If desired, local connections 196 can be provided on the adapter (shown schematically). Local connections 196 allow for local connection of a local indicator such as a d'Arsonval meter movement across rectifier 194. The local connections 196 also allow a handheld serial communication device such as a Rosemount Model 275 HART Communicator to be connected across the instrument loop to permit a technician to perform test, service and diagnostic operations. The local connections 196 can be arranged as additional leads in the elastomeric boot. Alternatively, the local connections can be arranged in a sealed T-shaped adapter along the lines illustrated in U.S. Pat. No. 5,710,552 McCoy et al., with service contacts that are adapted for connection to electrical test hooks 197.

Figure 5:
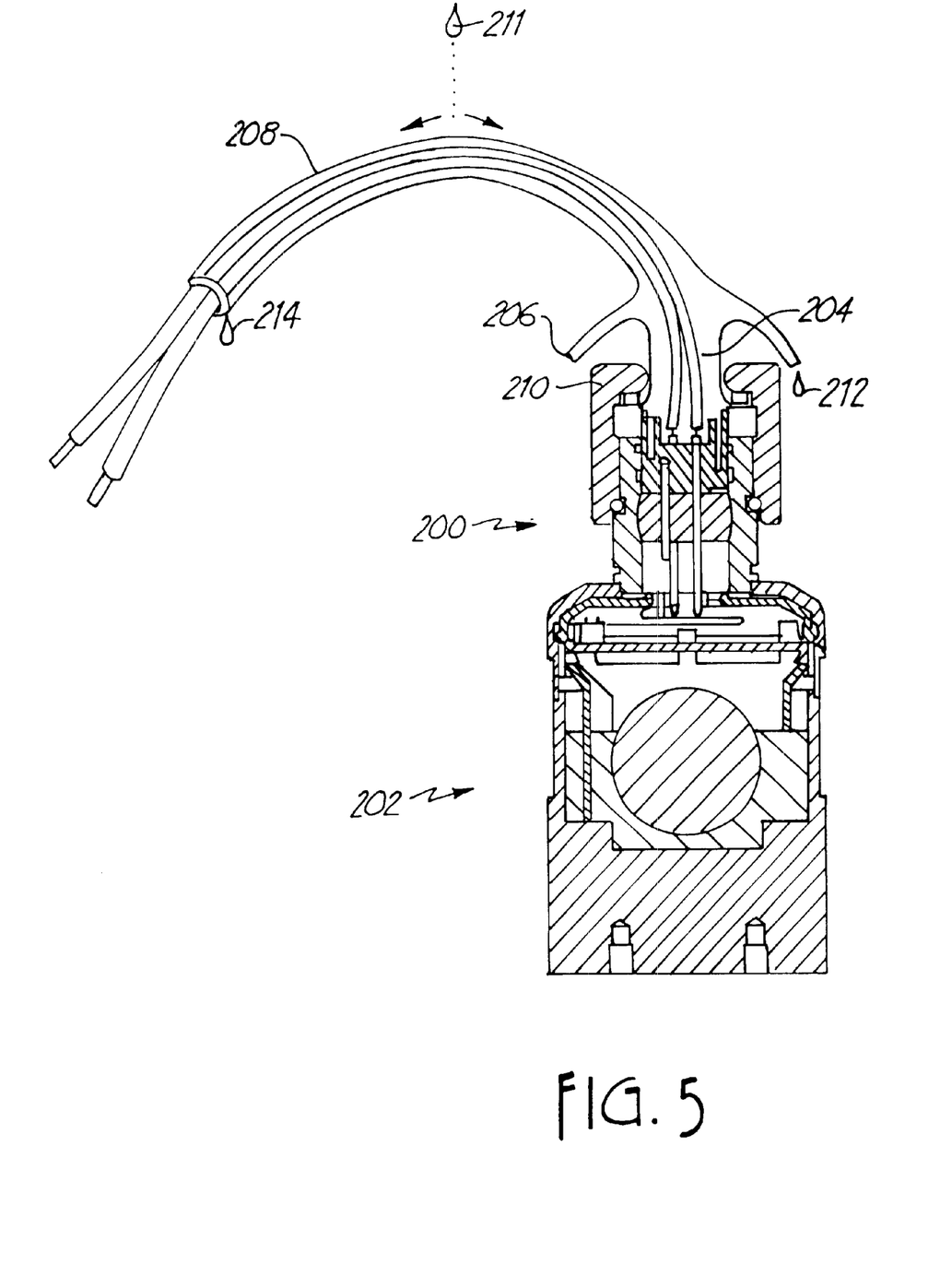
FIG. 5 is an illustration of an adapter with a drip shield and a boot extension.

FIG. 5 illustrates an adapter 200 mounted on a process transmitter 202. Adapter 200 is similar to adapter 130 illustrated in FIG. 2, however in FIG. 5, an elastomeric boot 204 extends outwardly to include a drip shield 206 and a boot extension 208. The drip shield 206 extends beyond the outer periphery of the sleeve 210. Drip shield 206 provides a kind of "umbrella" over the perimeter of sleeve 210 of adapter 200. When liquid 211 runs down the boot extension 208 toward the adapter 200, the drip shield 206 diverts the liquid so that that it drips off as illustrated at 212 without flowing into the adapter 200. Boot extension 208 is long enough so that it extends along the loop wires to a boot end, and the length of the boot extension is adequate to bend the boot extension more than 90 degrees. This allows liquid 211 that drips on the boot extension to drip downwardly off the boot extension as illustrated at 214. This avoids having gravity force liquid into the end of boot extension 208 because the end of the boot extension 208 faces downwardly.

Figure 6:
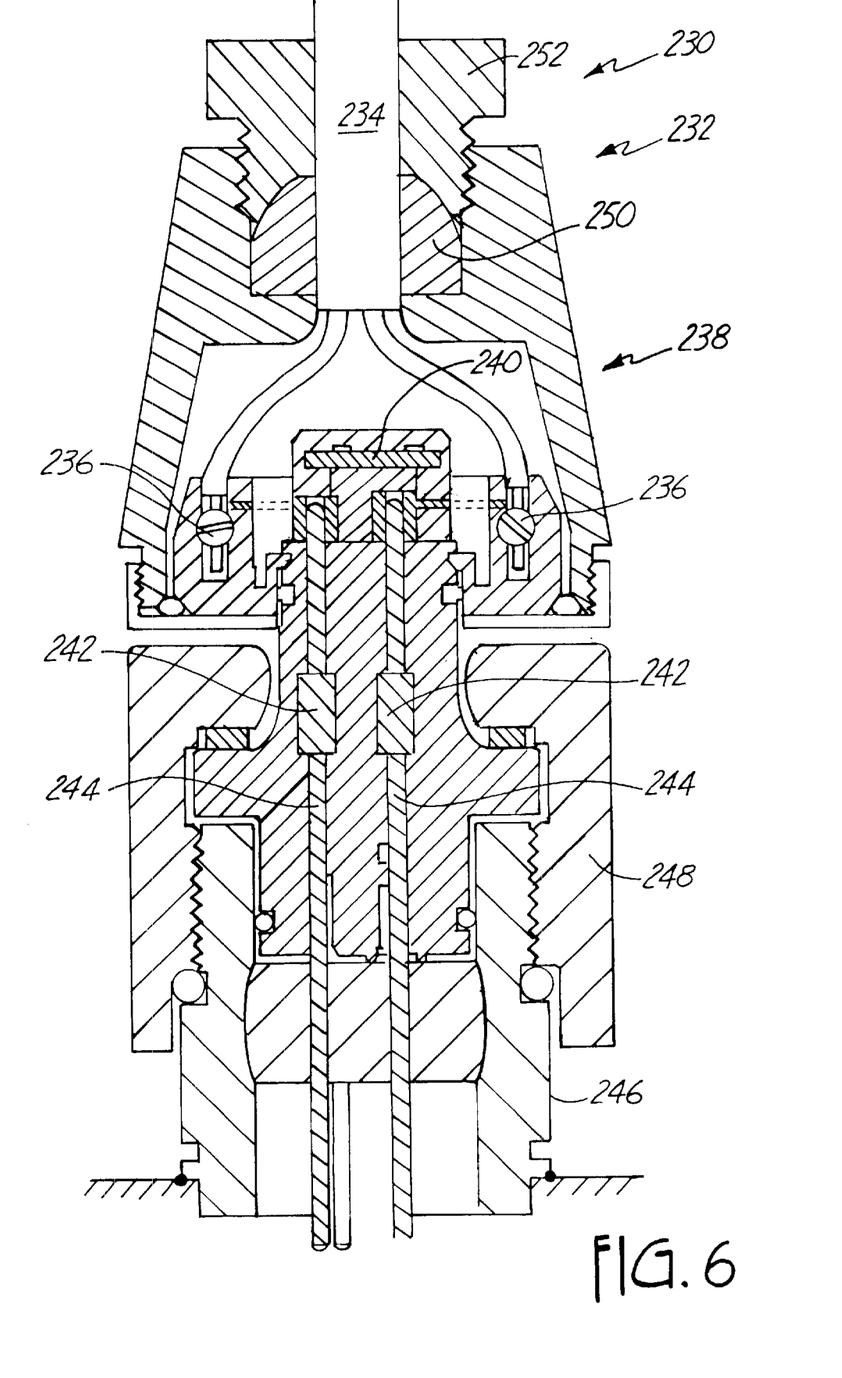
FIG. 6 is an illustration of an environmentally sealed adapter with a cable gland seal.

FIG. 6 illustrates an environmentally sealed adapter 230 that includes a cable gland seal 232. Cable gland seal 232 is a compression sleeve that is compressed to form a seal around cable 234. Adapter 230 is similar to the adapter illustrated in FIG. 3, however, adapter 230 allows the end of an instrument circuit cable 234 to be assembled to the adapter 230 by a technician in the field. Adapter 230 includes screw style compression terminals 236, an RFI/EMI filter that includes a circuit board 240 and ferrite sleeve inductors 242 that are installed around feedthrough conductors 244. The adapter 230 is fitted to a header 246 using an adapter ring 248. The cable gland seal 232 includes an elastomeric seal 250 that is compressed by a threaded gland nut 252.

Figure 7:
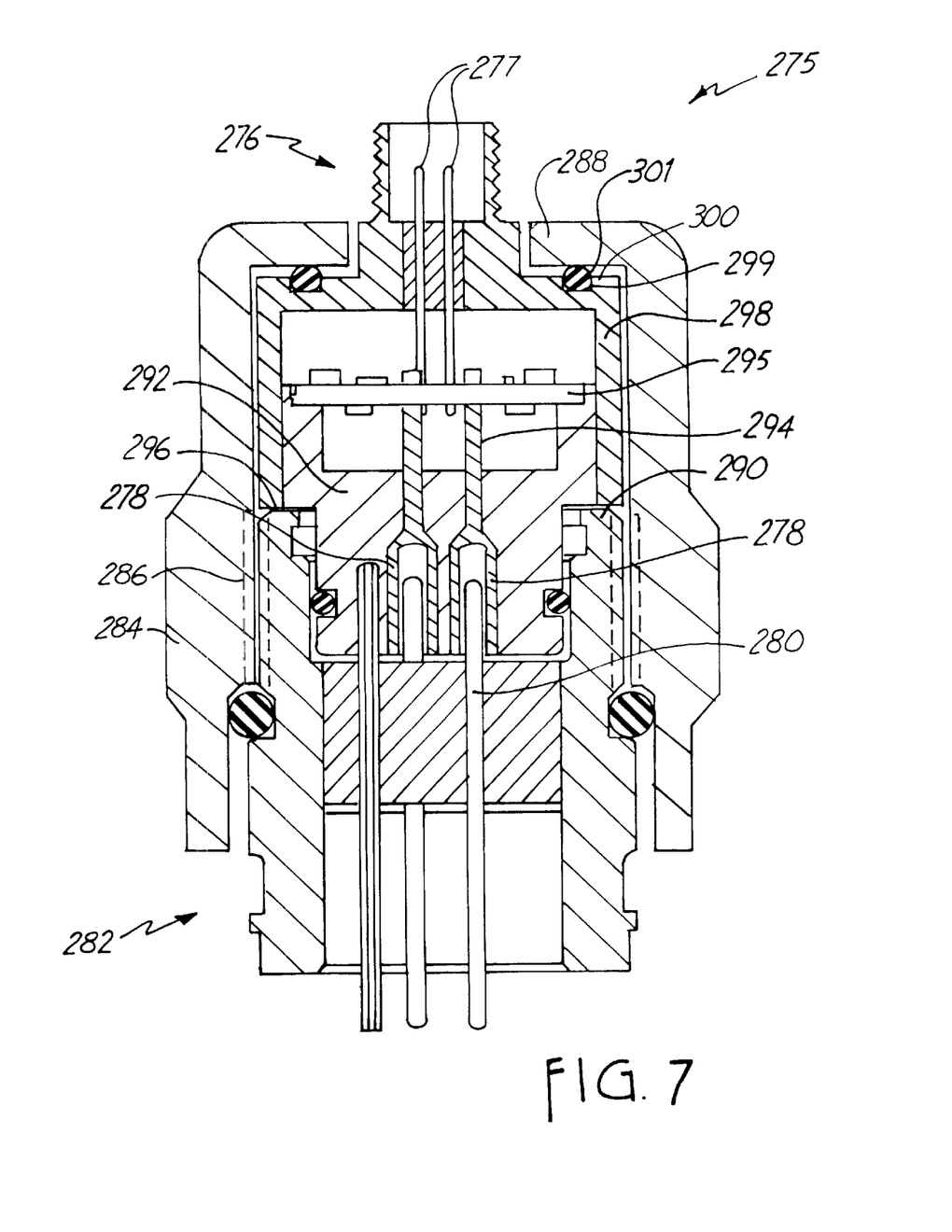
FIG. 7 is an illustration of an environmentally sealed adapter with a connector for a standard cordset.

FIG. 7 illustrates an environmentally sealed adapter 275 with a circular connector 276 for connection with a standard cordset.

Adapter 275 is an environmentally sealed instrument loop adapter and includes contact sockets 278 that mate with contact pins 280 inside a connector header 282 of a process transmitter. Adapter 275 also connects with first wire ends in a cordset (not shown) connecting with an instrument loop at circular connector 276.

The contact sockets 278 are configured in rigid plastic insulating support 292 to mate with contact pins 280 inside the connector header 282 on a process transmitter.

The sleeve 284 is configured to screw on the header 282 at threads 286. The sleeve 284 has a lip 288 that is configured to face the header 282. A cup-shaped washer 298 is located between the lip 288 and the header 282. The cup-shaped washer 298 has a washer surface 300 that faces the lip 288 and includes a sealing groove 299.

The circular connector 276 is integrally formed in the center of the cup-shaped washer 298. Circular connector 276 has second pins 277 connecting with the contact sockets 278 through an RFI/EMI filter 295. Circular connector 276 is configured to plug into an instrument loop using a standard cordset.

A liquid-proofing elastomeric seal 301 is disposed in the sealing groove 299 and seals to the lip 288 as the sleeve 284 is screwed on the header 282. Elastomeric seal 301 can be a standard O-ring.

Figure 8A:
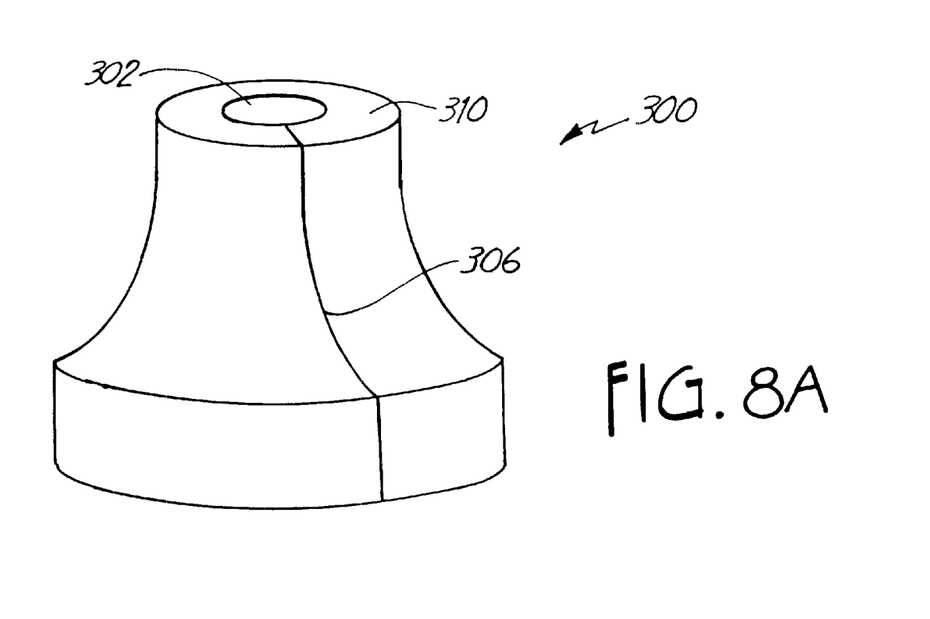
FIGS. 8A and 8B are illustrations of an elastomeric drip shield.
Figure 8B:
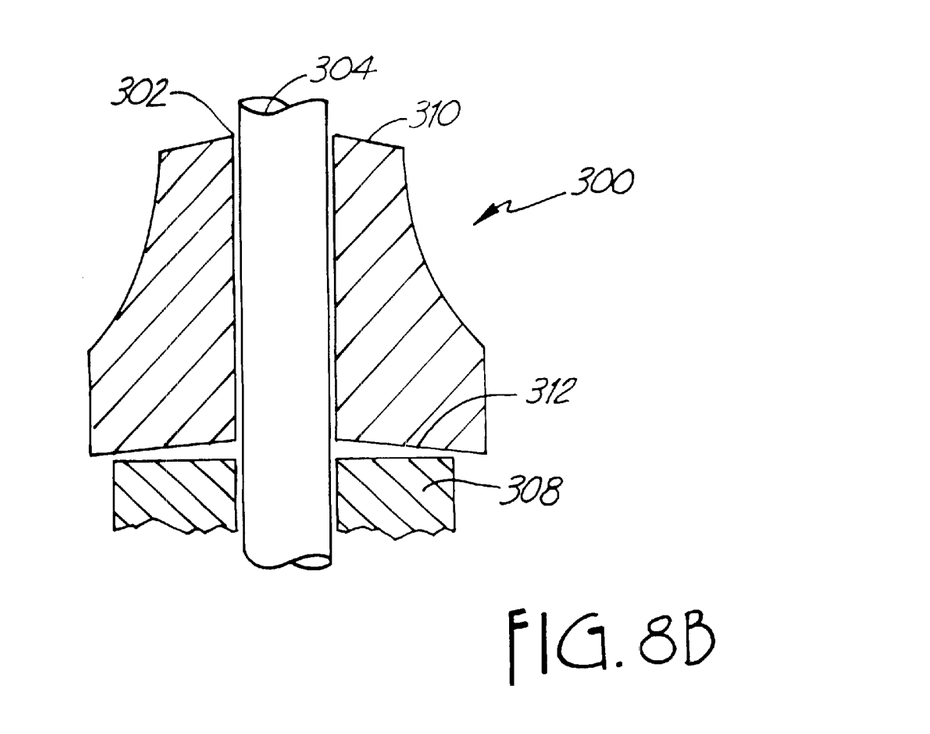

FIGS. 8A and 8B illustrate an elastomeric drip shield 300 that is molded from elastomeric material. Drip shield 300 has a central passageway 302 for a cable 304 and is split at 306 so that it can be easily slid over cable 304 after cable 304 is installed on an environmentally sealed instrument loop adapter shown very generally at 308. Drip shield 300 functions as a liquid-shedding "umbrella" for the adapter 308. Drip shield 300 extends radially beyond the adapter 308 and has conical beveled surfaces 310 and 312 to encourage water to drain away from the adapter 308. Drip shield 300 is an alternative to the integral drip shield 206 illustrated in FIG. 5. Drip shield 300 provides an added measure of protection against moisture entering the adapter 308.

The environmentally sealed elastomeric boots of FIGS. 2, 3, 5, 6 and the drip shields of FIGS. 5, 8A, 8B are preferably made from elastomers such as Santoprene or Monoprene. The supports 158, 159 are preferably made from a rigid plastic such as Valox.

The threads on the sleeves are preferably 1⅛"-18-UNEF threads. The circular connector 276 illustrated in FIG. 7 is preferably compatible with ANSI B93.55M-1981 (R1988) and preferably has performance characteristics according to IEC 61076-2-101. In particular, connectors adaptable to Euronorm EN 60947-5-2 with M12 threads can be used for circular connector 276.

With the present invention, transmitters can be easily replaced in the field by unplugging an old transmitter and plugging in a new transmitter. Connections can be made quickly with less chance of human error. The connections can be made quickly and the use of wiring compartments and large terminal blocks is avoided.

Although the present invention has been described with reference to preferred embodiments, workers skilled in the art will recognize that changes may be made in form and detail without departing from the spirit and scope of the invention. Features illustrated in one embodiment can be appropriately adapted to other illustrated embodiments.

What is claimed is:

1. An environmentally sealed instrument circuit adapter, comprising:

contact sockets configured to mate with contact pins inside a connector header on a process transmitter, the connector header having a sealing surface, and also configured to connect with conductors of an instrument circuit;

a rigid insulating support that supports the contact sockets;

a sleeve with threads configured to screw onto the connector header, the sleeve having a lip;

an environmentally sealing elastomeric boot configured to seal the circuit conductors of the instrument circuit and having a elastomeric rim between the lip and the sealing surface; and at least one washer located between the lip and the elastomeric rim, the washer having a washer surface that slides relative to the lip as the sleeve is screwed on so that twisting of the elastomeric rim is limited as the sleeve is tightened on the connector header to form a liquid-proof seal between the elastomeric rim and the sealing surface.

2. The adapter of claim 1 further comprising a plurality of washers with sliding washer surfaces between the lip and the elastomeric rim.

3. The adapter of claim 1 wherein the conductors are sealed to the adapter with a cable gland seal.

4. The adapter of claim 1 wherein the elastomeric boot is molded around the circuit conductors.

5. The adapter of claim 1 further comprising a drip shield that extends beyond an outer periphery of the sleeve.

6. The adapter of claim 5 wherein the drip shield has a bottom surface that is beveled.

7. The adapter of claim 1 wherein the elastomeric boot includes a boot extension that extends along the conductors to a boot end, and the length of the boot extension is adequate to bend the boot extension more than 90 degrees.

8. The adapter of claim 1 wherein the circuit wires have second wire ends connected to service contacts that are adapted for connection to electrical test hooks.

9. The adapter of claim 1 wherein the circuit wires have second wire ends connected to an electrical connector generally in conformance with ANSI Standard B93.55M.

10. The adapter of claim 1 wherein the circuit wires have second wire ends connected to an electrical connector generally in conformance with IEC 60947-5-2.

11. The adapter of claim 1 wherein the elastomeric boot is formed of Santoprene.

12. The adapter of claim 1 wherein the elastomeric boot is formed of Monoprene.

13. An environmentally sealed instrument circuit adapter, comprising:

contact sockets configured to mate with contact pins inside a connector header on a process transmitter;

a sleeve configured to screw on the header, the sleeve having a lip that is configured to face the header;

a cup-shaped washer located between the lip and the header, the cup-shaped washer having a washer surface that faces the lip and includes a sealing groove;

a circular electrical connector integrally formed in the center of the cup-shaped washer, the circular electrical connector having second pins connecting with the contact sockets and also configured to connect with conductors of an instrument circuit; and a liquid-proofing elastomeric seal disposed in the sealing groove and configured to seal to the lip as the sleeve is screwed on the header.

14. The adapter of claim 13 wherein the second pins connect with the contact sockets through an RFI/EMI filter.

15. An environmentally sealed instrument circuit adapter, comprising:

contact sockets configured to mate with contact pins inside a connector header on a process transmitter and also configured to connect with first wire ends of a two wire 4–20 mA loop;

a rigid insulating support that supports the contact sockets;

a sleeve configured to screw on the header, the sleeve having a lip that is configured to face a sealing surface on the header; and an environmentally sealing elastomeric boot configured to seal to loop conductors of an instrument loop and having a elastomeric rim between the lip and the sealing surface.

16. The adapter of claim 15, further including the process transmitter.

17. The adapter of claim 15 further comprising a circuit board in the elastomeric boot.

18. The adapter of claim 17 wherein the circuit board comprises an RFI/EMI filter.

19. The adapter of claim 15 further comprising an O-ring seal between an outer surface of the connector header and the sleeve.

* * * * *

UNITED STATES PATENT AND TRADEMARK OFFICE
CERTIFICATE OF CORRECTION

PATENT NO. : 6,511,337 B1
DATED : January 28, 2003
INVENTOR(S) : Fandrey et al.

It is certified that error appears in the above-identified patent and that said Letters Patent is hereby corrected as shown below:

<u>Title page,</u>
Item [56], References Cited, U.S. PATENT DOCUMENTS, add:
-- 4,791,352    12/1988    Frick et al...........324    60
   6,005,500    12/1999    Goboury et al.......341    43
   6,285,964    9/2001     Babel et al..........702    121--

Signed and Sealed this

Twenty-seventh Day of January, 2004

JON W. DUDAS
*Acting Director of the United States Patent and Trademark Office*